(12) United States Patent
Rios et al.

(10) Patent No.: US 10,950,301 B2
(45) Date of Patent: Mar. 16, 2021

(54) TWO TRANSISTOR, ONE RESISTOR NON-VOLATILE GAIN CELL MEMORY AND STORAGE ELEMENT

(71) Applicant: Intel Corporation, Santa Clara, CA (US)

(72) Inventors: Rafael Rios, Austin, TX (US); Abhishek Anil Sharma, Hillsboro, OR (US); Van H. Le, Portland, OR (US); Gilbert William Dewey, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/320,023

(22) PCT Filed: Sep. 30, 2016

(86) PCT No.: PCT/US2016/054721
§ 371 (c)(1),
(2) Date: Jan. 23, 2019

(87) PCT Pub. No.: WO2018/063308
PCT Pub. Date: Apr. 5, 2018

(65) Prior Publication Data
US 2019/0252020 A1 Aug. 15, 2019

(51) Int. Cl.
G11C 13/00 (2006.01)
H01L 45/00 (2006.01)
(Continued)

(52) U.S. Cl.
CPC ........... *G11C 13/0007* (2013.01); *G11C 8/16* (2013.01); *G11C 13/003* (2013.01);
(Continued)

(58) Field of Classification Search
CPC .............. G11C 13/0007; G11C 13/003; G11C 13/0038; G11C 13/004; G11C 13/0069
See application file for complete search history.

(56) References Cited

U.S. PATENT DOCUMENTS 8,619,459 B1    12/2013   Nguyen et al.
8,901,527 B2    12/2014   Hsieh et al.
(Continued)

OTHER PUBLICATIONS

International Preliminary Report on Patentability for International Patent Application No. PCT/US2016/054721 dated Apr. 11, 2019, 11 pgs.
(Continued)

Primary Examiner — Mushfique Siddique
(74) Attorney, Agent, or Firm — Schwabe, Williamson & Wyatt, P.C.

(57) ABSTRACT

A two transistor, one resistor gain cell and a suitable storage element are described. In some embodiments the gain cell has a resistive memory element coupled to a common node at one end to store a value and to a source line at another end, the value being read as conductivity between the common node and the source line of the resistive memory element, a write transistor having a source coupled to a bit line, a gate coupled to a write line, and a drain coupled to the common node to write a value at the bit line to the resistive memory element upon setting the write line high, and a read transistor having a source coupled to a bit line read line and a gate coupled to the common node to read the value written to the resistive memory element as a value at the second transistor gate.

19 Claims, 6 Drawing Sheets

(51) Int. Cl.
*H01L 27/24* (2006.01)
*G11C 8/16* (2006.01)

(52) U.S. Cl.
CPC ........ *G11C 13/004* (2013.01); *G11C 13/0038* (2013.01); *G11C 13/0069* (2013.01); *H01L 27/2436* (2013.01); *H01L 45/08* (2013.01); *H01L 45/12* (2013.01); *H01L 45/1233* (2013.01); *H01L 45/146* (2013.01); *H01L 45/147* (2013.01); *H01L 45/16* (2013.01); *H01L 45/1616* (2013.01); *H01L 45/1666* (2013.01); *G11C 2213/15* (2013.01); *G11C 2213/56* (2013.01); *G11C 2213/74* (2013.01); *G11C 2213/79* (2013.01); *G11C 2213/82* (2013.01)

(56) References Cited

U.S. PATENT DOCUMENTS

| | | |
|---|---|---|
| 8,963,114 B2 | 2/2015 | Liao et al. |
| 9,013,911 B2 | 4/2015 | Nazarian |
| 9,047,945 B2 | 6/2015 | Sutardja et al. |
| 9,209,392 B1 | 12/2015 | Sung et al. |
| 9,281,042 B1* | 3/2016 | Pelley ................. G11C 13/0069 |
| 2006/0002211 A1 | 5/2006 | Ye |
| 2012/0087172 A1* | 4/2012 | Aoki ................... G11C 13/0004 365/148 |
| 2013/0027081 A1* | 1/2013 | Nazarian ............ H03K 19/1776 326/44 |
| 2014/0269006 A1* | 9/2014 | Sekar .................. G11C 13/0023 365/148 |
| 2015/0170760 A1* | 6/2015 | Nardi ..................... G11C 27/02 327/94 |
| 2019/0080754 A1 | 3/2019 | Tran |
| 2019/0348115 A1 | 11/2019 | Sekar |

OTHER PUBLICATIONS

International Search Report and Written Opinion for International Patent Application No. PCT/US2016/054721 dated Jun. 26, 2017, 14 pgs.

* cited by examiner

TWO TRANSISTOR, ONE RESISTOR NON-VOLATILE GAIN CELL MEMORY AND STORAGE ELEMENT

CROSS-REFERENCE TO RELATED APPLICATION

This patent application is a U.S. National Phase Application under 35 U.S.C. § 371 of International Application No. PCT/US2016/054721, filed Sep. 30, 2016, entitled "TWO TRANSISTOR, ONE RESISTOR NON-VOLATILE GAIN CELL MEMORY AND STORAGE ELEMENT," which designates the United States of America, the entire disclosure of which is hereby incorporated by reference in its entirety and for all purposes.

FIELD

The present description is related to memory cells for semiconductors and, in particular, to two-transistor memory cells using a resistive device and a high speed read and write circuit.

BACKGROUND

In silicon semiconductor processors, memory is critical for performing many functions. For particularly high speed memory SRAM (Static Random Access Memory) is used. The SRAM circuits are usually embedded into the same die as logic circuitry, although discrete SRAM dies are also made. For embedded applications, the memory is built on the same die as the processor and so compatibility with CMOS (Complementary Metal Oxide Semiconductor) logic circuitry allows costs to be reduced. On the other hand a typical SRAM circuit has six transistors and so is expensive to produce in large numbers. SRAM also requires frequent refresh cycles and so it consumes power and generates heat.

2T (two transistor) or 3T memory gain cells are normally used for DRAM (Dynamic Random Access Memory). DRAM is not as fast as 6T SRAM but is less expensive and requires less frequent refresh cycles. A DRAM cell stores the memory state in a capacitor and so for optimum performance DRAM is built on separate dies for which the design of the capacitor is optimized. With a separate die, the DRAM can be made using the best or lowest cost techniques available for DRAM without regard to the logic circuitry. Nevertheless, there are still high off-state leakages that limit the retention times of the corresponding memory cell. Therefore, constant refresh cycles are required to retain the state stored in the memory. The refresh cycles require power so that DRAM also requires constant power and generates significant heat.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein a non-volatile resistive random access memory (RRAM) may be connected together with two thin-film MOSFET devices to make a two transistors and one resistor (2T-1R) memory element. One of the MOSFET devices is used to set and reset the RRAM element, while the other is used to read the memory state. This configuration offers higher density and lower leakage than a 6T circuit and many other types of high speed memory.

The read transistor of the described 2T-1R circuit provides good signal noise immunity. The 2T-1R bit cell can be implemented in backend layers of a semiconductor die leaving room underneath the bit cell for the control logic, decoders, and sense amplifiers. This provides an efficient use of space supporting high density memory applications. The bit cell itself can be made in a smaller area than standard 6T SRAMs.

A standard 1T-1R memory relies on current differences between the two memory states, requiring a high drive transistor and good signal-to-noise read solutions. The described 2T-1R bit cell does not require a high current drive device and the sensing may be done through the modulation of the ON/OFF condition of a read transistor. This is more robust to signal noise. Since the transistors don't need to have high performance, they may be made of smaller or lower cost designs, such as thin films integrated vertically in backend layers.

Figure 1:
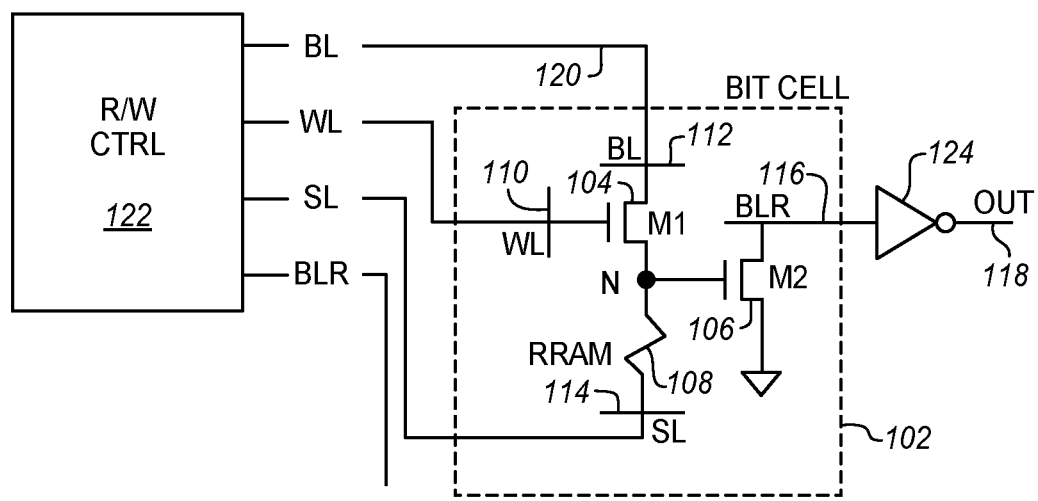
FIG. 1 is a circuit diagram of a two transistor one resistor memory cell according to an embodiment.

FIG. 1 is a circuit diagram of an example 2T-1R bit cell 102. A first, write transistor 104 has a source coupled to a bit line (BL) 112 a gate coupled to a word line (WL) 110 and a drain coupled to a node N. A second, read transistor 106 has a source coupled to a bit line read (BLR) line 116, a gate coupled to the node N and a drain set to low. The memory cell 108, such as an RRAM (Resistive Random Access Memory) 108 is coupled to the node N on one side and to a source line (SL) 114 on the other side. The output 118 on a read is taken from the BLR line. The input 120 is provided on the WL line. While the two transistors are referred to as a read transistor and a write transistor, other names may be used, such as ballast transistor and sense transistor, among others. The present description is directed toward devices with the functions or structures as shown, regardless of the terminology that is used.

The operation of the cell is described in Table 1 below. The three different high voltage levels H1, H2, and H3 are selected according to forming, setting, and resetting properties of the RRAM element 108 and the drive conditions of the first transistor device M1. The RRAM is set to a conductive state by driving a current across the RRAM device sufficient to form a filament across dielectric element of the RRAM. The RRAM is set to a nonconductive state by driving a reversed polarity current across the RRAM sufficient to break up the filaments that were formed.

In this circuit a filament is formed in the RRAM dielectric element by turning on device M1 with WL high and driving current from SL to BL. This is indicated in the first row, forming, of Table 1. To write or save a "1", the RRAM is set to a low resistance state (LRS) or conductive state by driving a current from SL to BL. To write a "0", the RRAM is reset to a high resistance state (HRS) by driving a current from BL to SL. In other words, an opposite current direction is applied in the write "0" row. This sets the high resistance state (HRS) or non-conductive state. To read the state of the RRAM, line BLR is first pre-charged to a high voltage and device M1 is turned on by applying a voltage to WL. The output OUT 118 is the inverse of the BLR state due to an inverter 124 between the second transistor source and the output line.

The node N between the first transistor 104 and the RRAM 108 forms a voltage divider. The voltage divider between the channel resistance of M1 and the RRAM element sets node N to a low value if the RRAM is in the LRS or to a high value if the RRAM is in the HRS. The resistive element 108 and device M1 104 may be designed such that node N is below or above a threshold voltage of the read device M2 106 when the RRAM is in LRS or HRS, respectively.

TABLE 1

|  | WL | BL | SL | BLR |
| --- | --- | --- | --- | --- |
| Forming | H | L | H1 | — |
| Write "1" | H | L | H2 | — |
| Write "0" | H | H3 | L | — |
| Read | H | H | L | Pre-charged |

A read/write controller 122 is coupled to the bit cell. Typically the controller will be coupled to many bit cells in an array or a block to control operations for many cells at the same time and to read and write words of 32, 64, 128 or another number of bits. The controller generates H, H1, H2, H3 and L levels of voltage and applies these voltage levels to the terminals of the bit cell, in this case WL, BL, SL, and may also read the value at BLR to obtain the stored value. The operations suggested by Table 1 and described in more detail with respect to FIGS. 3,4, 5, and 6 below may all be managed, controlled, and performed by the controller applying different voltages to the terminals of the bit cell.

Figure 2:
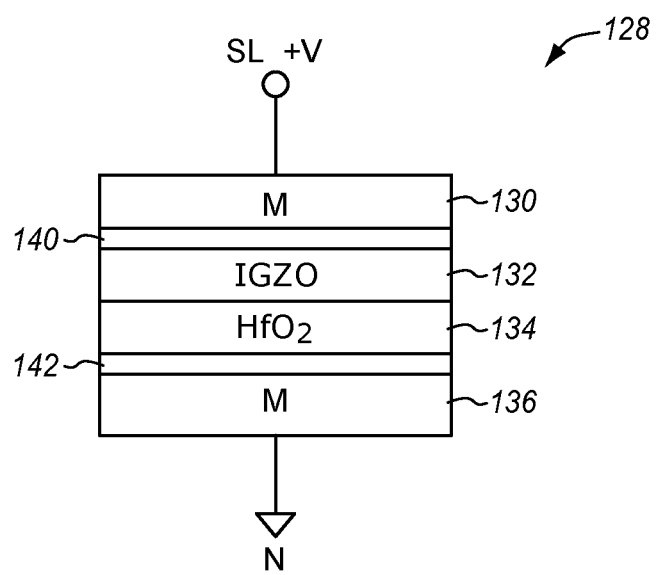
FIG. 2 is a diagram of a resistive cell suitable for use with the circuit of FIG. 1 according to an embodiment.

FIG. 2 is a diagram of an example resistive cell that may be used as the storage cell 108 of FIG. 1. The bit cell of FIG. 1 may also be operated with other types of resistive or variable conductivity memory devices. This cell is in the form of a single RRAM cell.

At the source line, the RRAM has a node that may be coupled to a positive or negative voltage to cause the conductivity of the cell to change. At the other end is a second node that corresponds to the common node N in FIG. 1. Each node or end is coupled to a metal layer 130, 136, such as tungsten or another suitable metal, that serves as a terminal for the RRAM element. Between the two metal layers is an $HfO_2$-IGZO RRAM element. This structure is formed of a conductive filament layer 134 made, for example of hafnium dioxide. The filament layer forms conductive filaments to reduce the resistance of the memory element. There is also an oxygen exchange layer 132 made, for example of a layer of indium gallium zinc oxide 132 with perhaps a diffusion layer between the two layers. The metal layers 130, 136 are isolated from the RRAM element 132, 134 each by a thin layer of dielectric, such as titanium nitride.

The $HfO_2$-IGZO RRAM requires relatively low operating voltages. The forming current is low and the LRS/HRS (Low Resistance State/High Resistance State) current ratio is close to 100. The device can be set and reset multiple times without degrading the LRS/HRS ratio. This provides that the device may be set or written and read reliably.

In many RRAM designs hafnium is used with an oxygen exchange layer (OEL). The two layers respond to a voltage applied to the two metal terminals by building filaments composed of oxygen vacancies in the hafnium layer. This drives oxygen into the oxygen exchange layer and converts $HfO_3$ in the hafnium layer into HfO. The result is a gradual reduction in the quality of the hafnium layer. The LRS/HRS current ratio slowly declines over time. This tendency in the HfO is ameliorated by the affinity of HfO to oxygen. The HfO seeks to attain more oxygen from the oxygen exchange layer to become $HfO_3$, but not enough to sustain the longevity of the RRAM cell.

With the IGZO instead of a more conventional oxygen exchange layer, the oxide is more stable than a typical OEL or hafnium layer and resists the collection of additional oxygen. Similarly the $HfO_2$ is a more stable state of hafnium and HfO and $HfO_3$. These oxides stabilize the formation and deformation of filaments between the two metal terminals. The result is a greater longevity and a slower decline in the LRS/HRS current ratio. The IGZO still absorbs oxygen but not as much as another hafnium layer such as HfO. The IGZO accordingly helps to further stabilize the $HfO_2$.

While the embodiments herein will be referred to as $HfO_2$ or hafnium and IGZO or AOS, other materials may be used. Alternatives for hafnium oxides include vacancy or metal doped $Ta_2O_5$, $TiO_2$, $TaAlO_x$ (x=2-4), $HfAlO_x$ (x=2-3.5), $HfZrO_x$ (x=2-4), $TaZrO_x$, $Nb_2O_5$, $NbO_2$, and other transition metal oxides and their composites.

Alternatives for IGZO include IZO (Indium Zinc Oxide), ITO (Indium Tin Oxide), $SnO_x$ (x=1-2), $CoO_x$ (x=0.5-2), amorphous Si, amorphous Ge, ZnO, $TiO_x$ (x=1-2), Hf-doped $HfO_2$, Ta-doped $Ta_2O_5$ and other thin film transistor materials.

Figure 3:
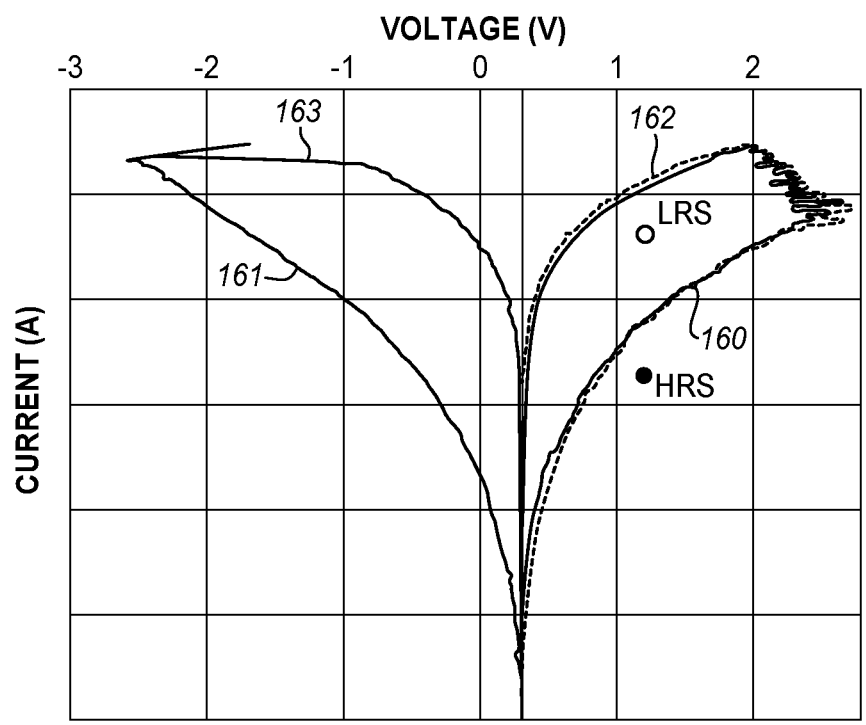
FIG. 3 is graph of current versus voltage for the circuit of FIG. 1 according to an embodiment.

The characteristics of the RRAM cell are shown in the graph of FIG. 3. FIG. 3 is a graph of current on the vertical axis against voltage on the horizontal axis. The graph shows that a low forming current with either a positive 160 or negative 161 polarity is sufficient to set the stat of the element with the measurable distance between the HRS and the LRS. Similarly the clearing voltage both positive 162 and negative 163 are not much greater than the forming voltage.

Figure 4:
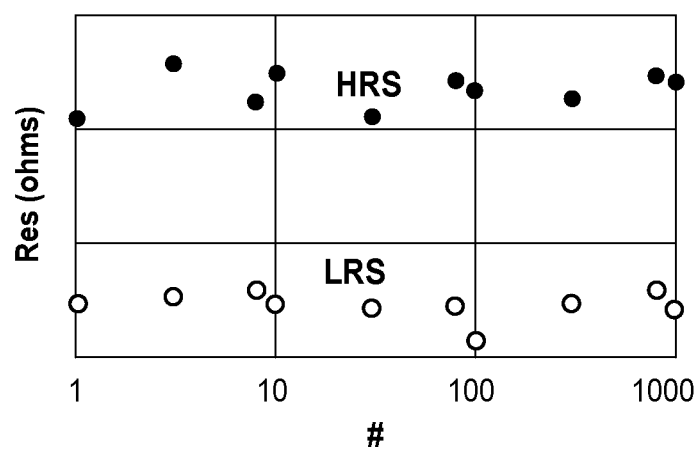
FIG. 4 is a graph of high and low state resistances over multiple setting cycles for the circuit of FIG. 1 according to an embodiment.

FIG. 4 is a graph of the HRS and LRS voltage on the vertical axis against the number of write cycles on the horizontal axis from one to 1000. As shown there is little change in HRS and LRS and even less change in the LRS/HRS current ratio after many repeated forming and deforming cycles of the memory cell.

Figure 5:
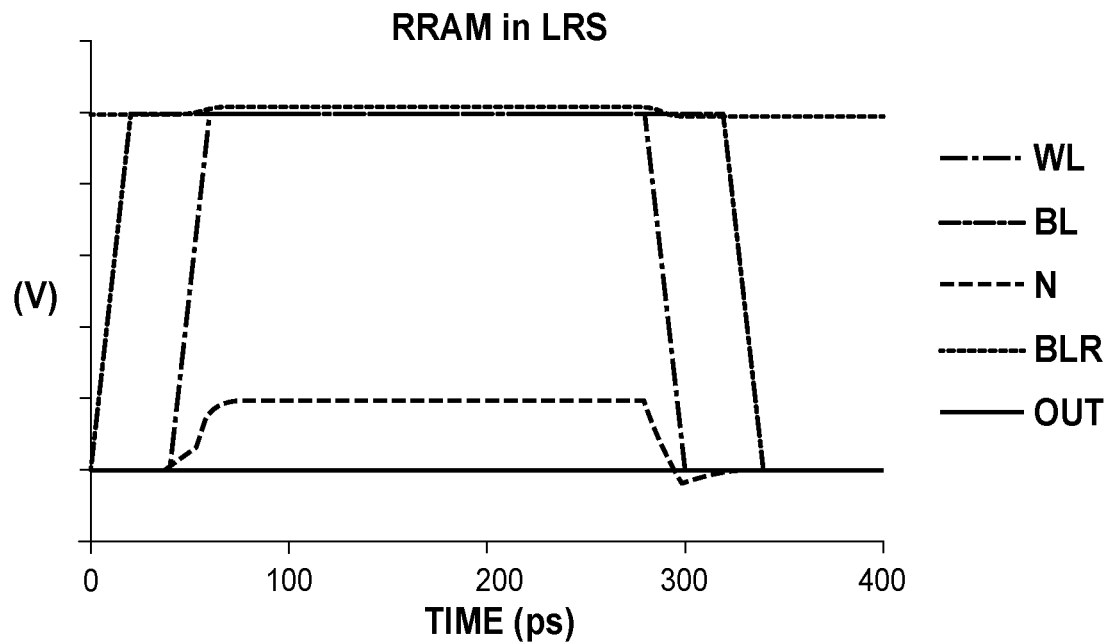
FIG. 5 is a graph of voltage versus time for a read operation of the circuit of FIG. 1 according to an embodiment.

FIG. 5 is a graph of voltages on the vertical axis over time on the horizontal axis at different lines of the bit cell circuit of FIG. 1 to read a LRS from an RRAM memory element in the bit cell. The described voltages may be supplied by the controller 122. At an initial state time 0 at the origin, the OUT level, BL, WL and N are all low, indicated here as 0 volts. OUT remains low and N remains nearly low. BLR is high and stays high throughout. In the LRS state, node N remains low nearly at zero volts and below the threshold voltage of the second trasnsistor 106 device M2. This keep the gate of the second transistor closed preventing BLR from discharging. With BLR high, the output node OUT remains low.

To read the LRS of the RRAM, first BL goes high, indicated as 1 volt, then SL goes high. Due to the highly conductive condition of the RRAM the high voltage flows through the RRAM this puts a pull up on N but does not the voltage is not maintained due to the flow through the RRAM. The voltage applied to the gate of the second transistor by the common node N is not enough to open the gate. As a result BLR stays high and the output or stored state at OUT stays low. When the read cycle is over, WL drops back down to low, then BL drops back down. Since N is always below the gate threshold voltage, BLR doesn't discharge and OUT remains low.

Figure 6:
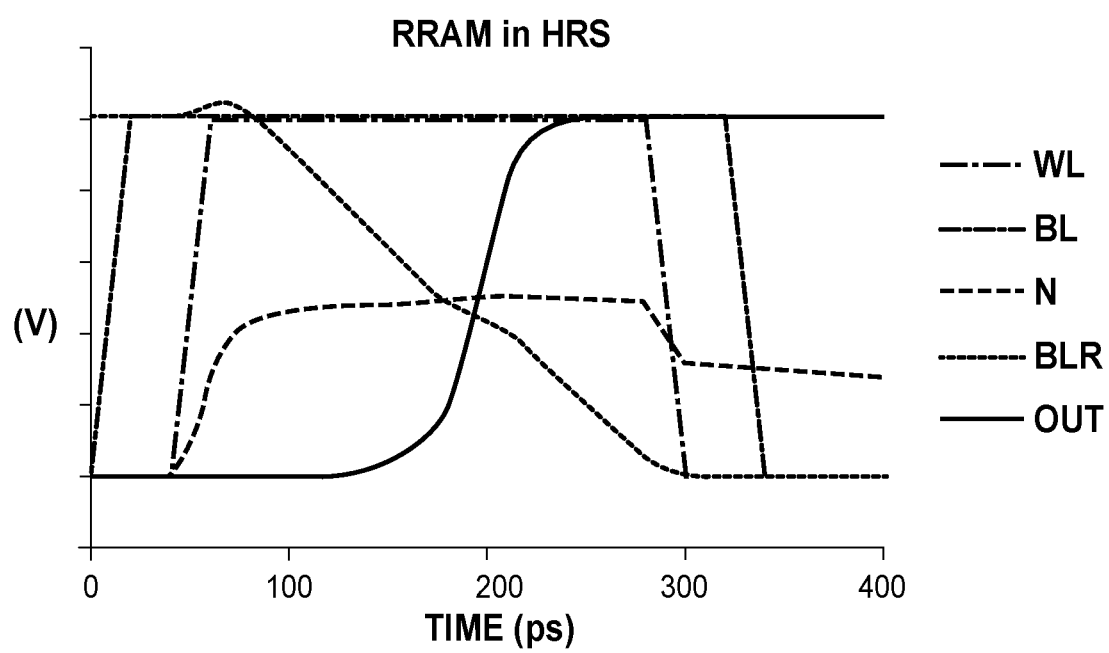
FIG. 6 is a graph of voltage versus time for a write operation of the circuit of FIG. 1 according to an embodiment.

FIG. 6 is a graph of voltages on the vertical axis over time on the horizontal axis for the same FIG. 1 bit cell operated in a HRS read operation. In this operation, the bit cell starts in the HRS state. The initial state of the lines is the same as before with WL, BL, N, and OUT at low at time 0 and BLR high. For the read operation again BL is set to high and then WL is set to high. In the HRS state, the voltage applied to N by raising WL and BL causes the potential to remain at N. N increases due to this applied voltage beyond the gate threshold voltage of the second transistor M2. This opens the gate of the second transistor forcing BLR to discharge and trigger the output driver.

As BLR drops, the output OUT flips to high. After this, the WL and then the BL return to low but the state at BLR and OUT remain reversed from the initial state. The final state of OUT and BLR at time 300 does not depend on the initial state but upon the state of the RRAM. This is true for both read operations. The scale of both read operations is in picoseconds showing that with appropriate transistor designs, a read operation may be completed in less than 500 picoseconds. This is fast enough for many high speed memory types.

As indicated by the graphs of FIGS. 3 and 4, the primary characteristic for the memory element 108 of the bit cell is to maintain a voltage at the common node which is either above or below the threshold voltage, depending on the stored state of the cell. This function is performed reliably over many cycles by the RRAM of FIG. 2, however, other devices may alternatively be used. A silicon or IGZO transistor, for example, may be used instead of the RRAM.

The difference between the stored high state (HRS) and the stored low state (LRS) as shown in FIGS. 3 and 4 is much less than the difference between the low voltage and the high voltage. In FIG. 4, the common node voltage only reaches a little above 30% of the high state. This is enough to trigger the second transistor, the read transistor. The read transistor is configured to have a threshold voltage that reacts to the voltage change that will be exhibited at the common node due to the storage cell 108. For a different storage cell, the threshold voltage may be made higher or lower by modifying the dimensions, materials, etc. of the read transistor. The read transistor is then connected across the full potential so that the voltage across the source and drain drive the output driver 124. As a result, the read transistor overcomes a lower voltage drop in the memory element and increases the efficiency of a corresponding memory array.

The operations of reading and writing with the described 2T-1R gain cell configuration and described in the context of Table 1 is similar to other 2T-1R gain cells. This configuration has an advantage in that the read and write paths are electrically isolated. This may be used to provide a higher read bandwidth by having a faster read transistor. A dense and hence slower write or ballast transistor may be used and neither transistor will significantly affect the other due to the electrical isolation. Most uses of embedded non-volatile memories are dominated by reads so a faster read provides a significant user benefit.

In addition, the transistors described herein may be fabricated in planar technology or in backend metal layers. Multiple different structures that embody the same gain-cell may be used. By fabricating the gain cell in back end layers, a memory array may be added to a die and connected to the logic circuitry without consuming any of the planar logic or other logic area. This provides new architectures for high density memory without requiring a separate memory die.

Figure 7:
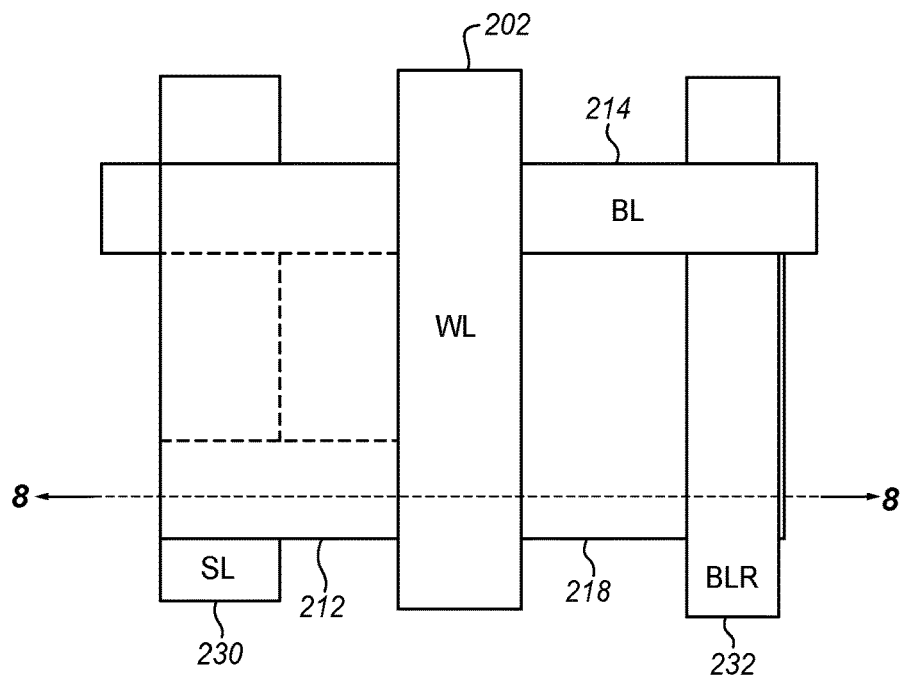
FIG. 7 is a top view diagram of a two transistor one resistor memory cell according to an embodiment.
Figure 8:
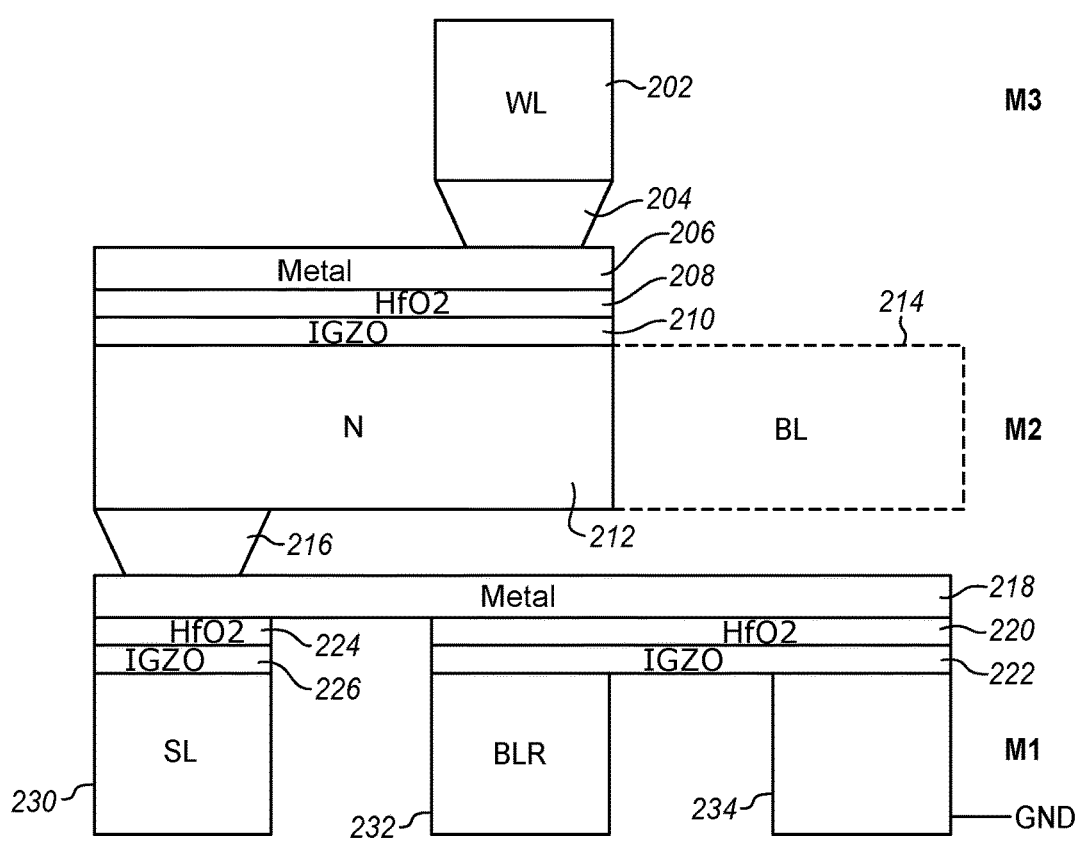
FIG. 8 is a side cross-sectional view diagram of a two transistor one resistor memory cell according to an embodiment.

FIG. 7 is a top elevation view diagram of a two transistor, one resistor (2T-1R) bit cell layout as it may be formed over a silicon or other substrate. FIG. 8 is a cross-sectional side view of the same bit cell structure taken along line 8-8 of FIG. 7. The layout and cross section of the 2T-1R bit cell is integrated vertically between three backend metal layers identified as M1, M2, and M3. These may be in metal layers identified as M1, M2, and M3 or in any other metal layers. The metal layers are separated by interlayer dielectric. The interlayer dielectric or another dielectric may also be used to isolate parts of a metal layer from another part of the same metal layer to form terminal or conductive lines as shown. While a back end metal integration is shown the bit cell of FIG. 1 may be fabricated in different technologies and may be planar or vertical, depending on the implementation. In addition, the illustrated structure may be inverted so that the WL is formed in M1 and the BLR is formed in M3.

The lower most metal layer M1 provides metal material for three of the terminals SL 230, BLR 232, and GND 234 that are shown in FIG. 1. These terminals may be formed by etching or patterning the metal and providing a dielectric layer to isolate the terminals from each other. A layer of IGZO 222 or similar oxide is formed over and across the BLR and GND 234. A layer of HfO$_2$ 220 is formed over the IGZO layer 222 to form the gate channel for the second or read transistor. At the same time a layer of IGZO 226 and then a layer of HfO$_2$ 224 are formed over the SL terminal to form the resistive element of the RRAM element. A metal layer 218 is then deposited over the hafnium layers 220, 224 connecting them together to form a connection to the common node N.

The common node N 212 is formed in the next metal layer M2 and is connected to the gate of the read transistor and the end node of the RRAM element by a conductive pillar 216 to the deposited metal connector 218. The write transistor is then formed over the common node 212. As mentioned above, the write transistor may be formed below the read transistor. Multiple layers of read and write transistors may be stacked in the metal layers to increase the density of a memory array. The transistors may be stacked with some formed as shown and other inverted so that common lines may be shared. The controller 122 may be formed in the metal layers or in planar silicon circuitry below the metal layers and connected by vias through the metal layers and the interlayer dielectric.

For the write transistor, the common N node 212 which is the drain and the BL or source 214 are formed side-by-side in the same metal layer M2. This is similar to the BLR 232 and GND 234 of the read transistor but rotated ninety degrees so that the drain is in the plane of the page of FIG. 8, but the source is behind the plane of the page. Layers are formed over and across these two to form the gate channel as in the example of the write transistor. First an IGZO layer 210, then a hafnium $HfO_2$ 208 over the IGZO, then a metal layer 206 over the hafnium. A pillar 204 connects the top metal layer to the next back end layer M3. The WL terminal 202 is formed in the topmost metal layer. Additional terminals for other devices or for another layer of bit cells may be formed in this top layer M3 and then additional layers may be formed over the topmost layer.

As shown the RRAM memory cell and driver device can be done within the same IGZO 222, 226 and $HfO_2$ 220, 224 layers. To further increase cell density, the read transistor can be integrated vertically on the next metal layer M3. And since the whole bit cell resides in backend layers, the control logic can be integrated below rather than on the periphery of the memory array as in standard SRAM memories, saving more real estate.

From the perspective of the top view of FIG. 7, SL, BLR, and GND of M1 extend across the horizontal extent of the device (shown as top to bottom in the top view). Similarly WL extends across the horizontal extent of the device in M3 obscuring BLR. BL extends across the horizontal extent of the device in an orthogonal direction (shows as left to right in the top view) and is parallel to the common node N. Common node N extends only between SL and BLR (obscured). The deposited metal layers 206, 208 extend across the horizontal extent of the device in one direction shown as vertical in the top view, but the top metal layer 218 does not extend across the horizontal extent in the other direction shown as left to right in both the top and side views.

The illustrated structure for the device is intended to provide a maximum area for the IGZO and hafnium layers within the allotted area. The horizontal connecting lines SL, BLR, GND, BL, and WL may extend beyond the device to make contact with other components for control, read, and write. The structure is shown with the ends cut off of all of these connecting lines, but in an array, they will continue to make other connections that are not shown here. The structure may be modified to suit different form factors.

The described examples all show the same type of $HfO_2$-IGZO structure, however, as mentioned above, other material may be used instead. At present these two materials have been thoroughly studied and characterized and they naturally complement each other in terms of stability. They provide stable filamentary switching in the RRAM. The IGZO also provides a gentler gettering or oxygen absorption action than hafnium or other many other metal OEL (Oxygen Exchange Layer). Other materials may be preferred for different uses, structures, or implementations.

Figure 9:
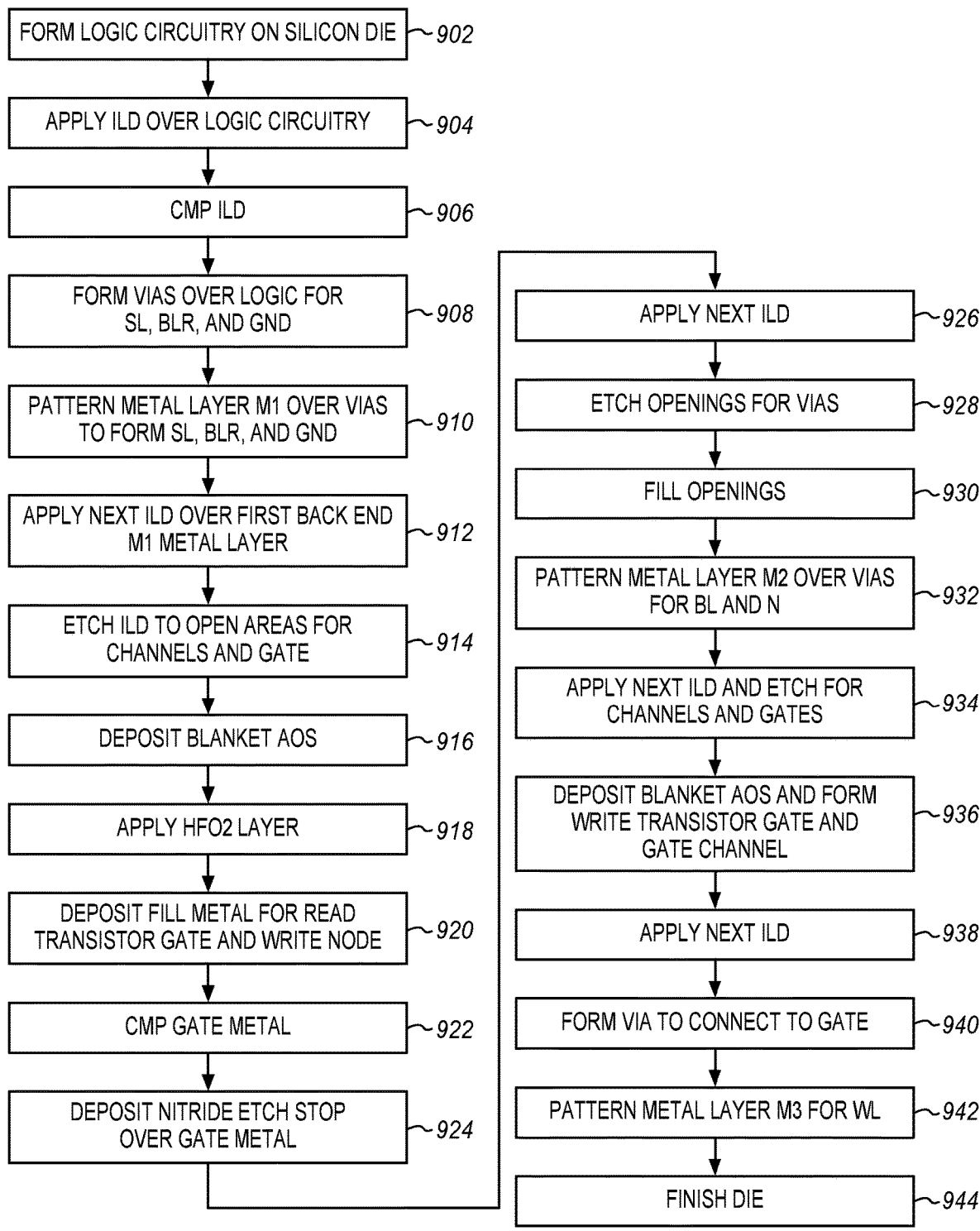
FIG. 9 is a process flow diagram of fabricating a two transistor one resistor memory cell according to an embodiment.

FIG. 9 is a process flow diagram for forming a 2T-1R memory cell array with charging transistors in BEOL (Back End of the Line) layers as shown in FIGS. 7 and 8. At 902 the logic circuitry is formed on the silicon die, this includes the control and voltage supply circuitry for each memory cell of the array as well as the read, write, refresh and other circuitry. At 904 an interlayer dielectric is applied over the logic circuitry. There may also be other layers applied over the logic circuitry depending on the particular implementation.

The read transistor is designed for low leakage with thick gates and for fast reads. The logic circuitry layer also includes the RBL, RWL, and WWL for the memory cell and the necessary circuitry to activate and drive these lines.

At 906 a CMP (chemical metal planarization) is applied over the dielectric layer. At 908 vias are formed over logic circuitry to provide access to the SL, BLR, and GND terminals to be formed in the first metal layer. The vias may be formed by etching an opening into the planarized ILD and then filling the opening with copper or another suitable conductor. A metal layer is then patterned and applied at 910 over the vias and the rest of the dielectric to form the source and drain areas of the read transistor and the source line of the RRAM cell. This layer is shown as M1 in FIG. 8. As mentioned above, there may be other metal and dielectric layers formed over the logic circuitry before this layer which has the SL, BLR, and GND terminals. At 912, the next layer of dielectric is applied over the first back end metal layer. The metal may first be planarized and protected with a nitride etch stop layer before the next layer of ILD is applied.

At 914, the dielectric is etched to open areas for the hafnium-IGZO channels and metal gate. In this operation, the ILD and nitride etch stop layer are removed to expose the metal lines corresponding to the sources and drain.

With the gate opening made, at 916 a blanket AOS (Amorphous Oxide Semiconductor) deposition is made using e.g. CVD so that the AOS is in contact with the source and drain of the charging transistor. For the charging transistor, an AOS with a low off state leakage, such as IGZO is chosen to reduce the refresh rate of the memory cell. The AOS deposition may be done using CVD (Chemical Vapor Deposition) or in any of a variety of other ways. Next at 918 an $HfO_2$ layer is applied using, for example, ALD (Atomic Layer Deposition) or any of a variety of other techniques. At 920 a fill metal is deposited to form the gate of the read transistor and the write node of the memory cell. A damascene approach may be used. The deposits may be blanket layer deposition so that the AOS material is in contact with the source and the drain.

At 922 CMP is used again to planarize the nitride over the metal of the gate. A nitride etch stop deposition is performed over the gate metal at 924 then another ILD layer is deposited 926 to form the level of the next metal layer. The ILD is planarized and then a via to the metal gate is formed. At 928 openings are etched for vias to the metal gate and to the lower metal layers for any other desired connections and at 930 these are filled with a conductor.

At 932 the next metal layer M2 is patterned with a gate electrode for BL and the common node and any other routing are formed in the next metal layer. These operations may be performed simultaneously for thousands or millions of memory cells in the same layers at the same time to produce a memory array that is very close to the logic circuitry and which does not add to the area of the die, only the height. If the array is formed in metal layers that are otherwise required, then the height also is not increased.

At 934, the top layer of ILD is formed over metal layer M2 and etched to open areas for the hafnium-IGZO channels and metal gate of the write transistor. In this operation, the ILD and nitride etch stop layer are removed to expose the metal lines corresponding to the common node drains and BL source. At 936 the gate and gate channel for the write transistor are formed using for example a blanket AOS (Amorphous Oxide Semiconductor) deposition followed by an HfO2 layer and then a fill metal is deposited to form the gate of the write transistor. At 938 another layer of ILD is applied over the gate layers and then planarized. At 940 a via is formed to connect to the metal gate and at 942 the next metal layer M3 is formed including a terminal for the WL gate over the via to the gate channel.

At 944 after the metal and ILD layers have been formed with the embedded memory array and any other components, then the die is finished with routing layers, contact pads, solder balls and any other desired components. Additional operations may also be applied to the back side of the die, such as thinning, applying heat spreaders and other operations.

Figure 10:
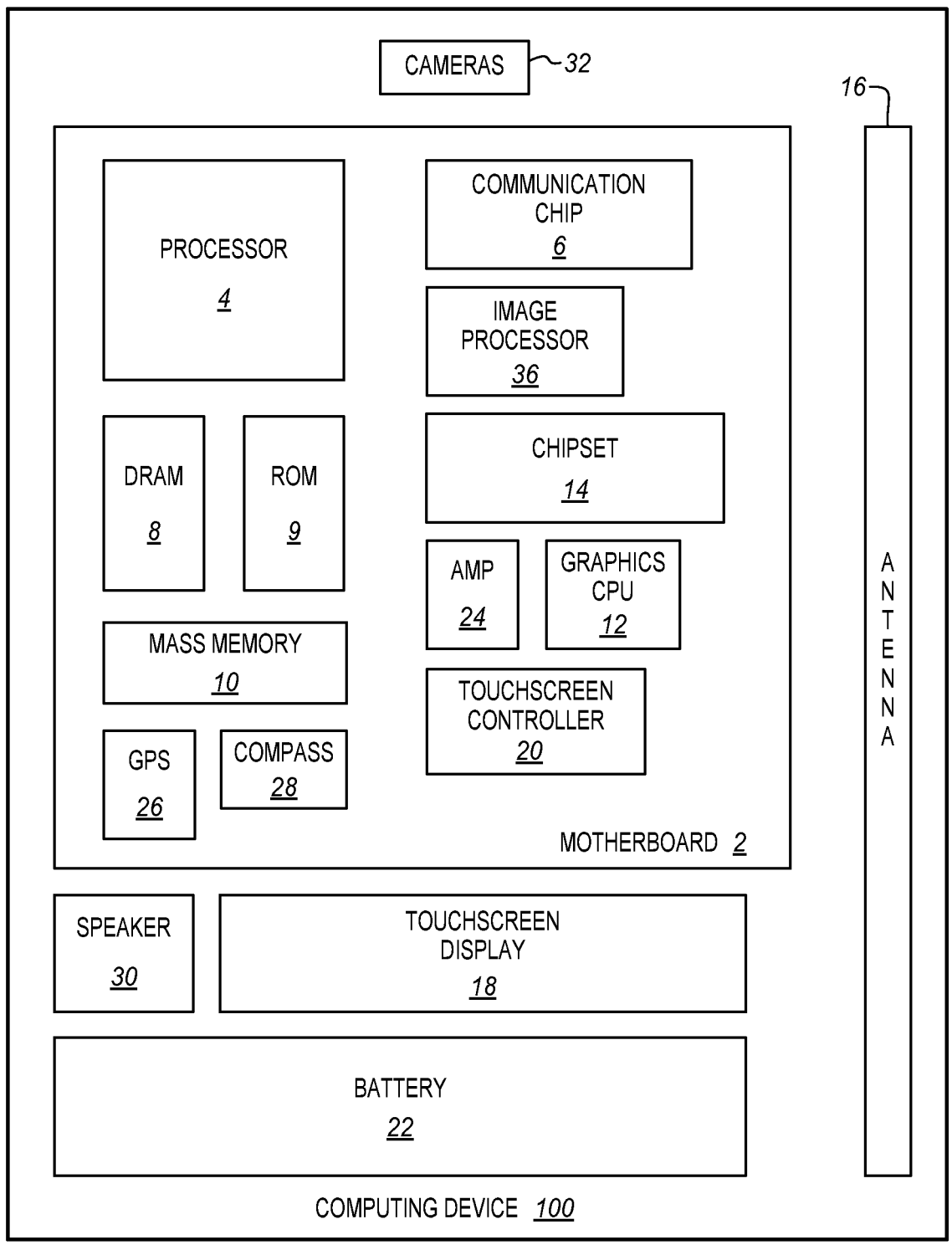
FIG. 10 is a block diagram of a computing device incorporating a die with a memory cell array according to an embodiment.

FIG. 10 illustrates a computing device 11 in accordance with one implementation. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, the integrated circuit die of the processor, memory devices, communication devices, or other components are fabricated to include two transistor, one resistor memory cells with an RRAM or other element as described herein. The described memory cells may be embedded as memory for other components in a CMOS or other logic processing die or a standalone memory array may be made on its own die. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a structure that includes a gain cell that has a resistive memory element coupled to a common node at one end to store a value and to a source line at another end, the value being read as conductivity between the common node and the source line of the resistive memory element, a write transistor having a source coupled to a bit line, a gate coupled to a write line, and a drain coupled to the common node to write a value at the bit line to the resistive memory element upon setting the write line high, and a read transistor having a source coupled to a bit line read line and a gate coupled to the common node to read the value written to the resistive memory element as a value at the second transistor gate.

Further embodiments include a voltage source coupled to the source line and to the bit line to set a first polarity between the source line and the bit line to write a first value to the resistive memory element and to set a second polarity between the source line and the bit line to write a second value to the resistive memory element.

In further embodiments the voltage source has three high voltages to apply to the source line and the bit line for writing the first and second values.

In further embodiments the memory element and the transistors are formed in metal layers of a semiconductor die over a controller formed in a planar semiconductor area of the die below the metal layers.

In further embodiments the source and drain of the read transistor are formed in a first back end metal layer of a semiconductor die and the common node is formed in a second back end metal layer of the die.

In further embodiments the source line of the memory element is formed in the first metal layer, the source of the write transistor is formed in the second metal layer, and wherein gate channels of the write and read transistors are formed in interlayer dielectric between the metal layers.

Some embodiments pertain to a resistive random access memory element that includes a first metal layer to provide a first electrical terminal, a second metal layer to provide a second electrical terminal, a conductive filament layer between the first terminal and the second terminal, and an oxygen exchange layer between the filament layer and the second terminal.

In further embodiments the filament layer is a transition metal layer.

In further embodiments the filament layer is a hafnium dioxide layer.

In further embodiments the oxygen exchange layer is metal oxide layer.

In further embodiments the oxygen exchange layer is an indium gallium zinc oxide layer.

Further embodiments include a first nitride layer between the filament layer and the first terminal and a second nitride layer between the oxygen exchange layer and the second terminal.

Further embodiments include a diffusion layer between the filament layer and the oxygen exchange layer.

In further embodiments the first and second metal layers are formed of tungsten.

Some embodiments pertain to a method of forming a resistive memory gain cell that includes patterning logic circuitry over a silicon substrate, applying a first interlayer dielectric (ILD) over the logic circuitry, patterning a first metal layer to form a source line terminal of a resistive memory element and a bit line read line and a ground terminal of a read transistor of the gain cell, applying a second ILD over the first metal layer, forming a resistive memory element over the source line in the ILD, a gate channel of the read transistor in the ILD, a metal terminal connecting the resistive memory element and the gate channel, patterning a second metal layer as a common node coupled to the metal terminal of the resistive memory element and a bit line terminal of a write transistor, applying a third ILD over the second metal layer, forming a gate channel of the write transistor in the third ILD coupled to the common node, and patterning a third metal layer as a write line of the write transistor coupled to the gate channel in the third ILD.

In further embodiments forming a resistive memory element includes etching an opening in the first ILD over the source line terminal, depositing an indium gallium zinc oxide layer in the opening over the source line terminal, depositing a hafnium dioxide layer over the indium gallium zinc oxide layer, and wherein the metal terminal is deposited in part over the hafnium dioxide layer.

Further embodiments include depositing a first nitride layer in the opening before depositing the hafnium dioxide and depositing a second nitride layer after depositing the indium gallium zinc oxide layer.

Some embodiments pertain to a computing system that includes a memory having instructions stored thereon, and a processor coupled to the memory to execute the instructions, the processor having silicon logic circuitry formed on a silicon substrate and a memory array having a plurality of gain cells, the memory array being formed in back end metal layers formed over the logic circuitry, the gain cells each having a resistive memory element coupled to a common node at one end to store a value and to a source line at another end, the value being read as conductivity between the common node and the source line of the resistive memory element, a write transistor having a source coupled to a bit line, a gate coupled to a write line, and a drain coupled to the common node to write a value at the bit line to the resistive memory element upon setting the write line high, and a read transistor having a source coupled to a bit line read line and a gate coupled to the common node to read the value written to the resistive memory element as a value at the second transistor gate.

In further embodiments the source and drain of the read transistor are formed in a first back end metal layer of a semiconductor die and the common node is formed in a second back end metal layer of the die.

In further embodiments the resistive memory element is formed of a first metal layer to provide a first electrical terminal, a second metal layer to provide a second electrical terminal, a hafnium dioxide layer between the first terminal and the second terminal, and an indium gallium zinc oxide layer between the hafnium dioxide layer and the second terminal.

The invention claimed is:

1. A resistive memory gain cell comprising:
   a resistive memory element coupled to a common node at one end to store a value and directly to a source line at another end, the value being read as conductivity between the common node and the source line of the resistive memory element;
   a write transistor having a source coupled directly to a bit line, a gate coupled to a write line, and a drain coupled to the common node to write a value at the bit line to the resistive memory element upon setting the write line high; and
   a read transistor having a source coupled to a bit line read line and a gate coupled directly to the common node to read the value written to the resistive memory element as a value at the read transistor gate, wherein the source and drain of the read transistor are formed in a first back end metal layer of a semiconductor die and the common node is formed in a second back end metal layer of the semiconductor die.

2. The gain cell of claim 1, further comprising a voltage source coupled to the source line and to the bit line to set a first polarity between the source line and the bit line to write a first value to the resistive memory element and to set a second polarity between the source line and the bit line to write a second value to the resistive memory element.

3. The gain cell of claim 2, wherein the voltage source has three high voltages to apply to the source line and the bit line for writing the first and second values.

4. The gain cell of claim 1, wherein the memory element and the transistors are formed in metal layers of a semiconductor die over a controller formed in a planar semiconductor area of the die below the metal layers.

5. The gain cell of claim 1 wherein the source line of the memory element is formed in the first back end metal layer, the source of the write transistor is formed in the second back end metal layer, and wherein gate channels of the write and read transistors are formed in interlayer dielectric between the first and second back end metal layers.

6. A resistive random access memory element comprising:
   a first metal layer to provide a first electrical terminal;
   a second metal layer to provide a second electrical terminal, the second electrical terminal having a surface;
   a conductive filament layer between the first electrical terminal and the second electrical terminal;
   an oxygen exchange layer between the conductive filament layer and the second electrical terminal, the oxygen exchange layer having a surface facing the surface of the second electrical terminal;
   a first dielectric layer between the conductive filament layer and the first electrical terminal; and
   a second dielectric layer between the oxygen exchange layer and the second electrical terminal, the second dielectric layer in direct contact with the surface of the oxygen exchange layer and in direct contact with the surface of the second electrical terminal, wherein the second dielectric layer separates the surface of the oxygen exchange layer from the surface of the second electrical terminal.

7. The element of claim 6, wherein the conductive filament layer is a transition metal layer.

8. The element of claim 6, wherein the conductive filament layer is a hafnium dioxide layer.

9. The element of claim 6, wherein the oxygen exchange layer is metal oxide layer.

10. The element of claim 6, wherein the oxygen exchange layer is an indium gallium zinc oxide layer.

11. The element of claim 6, wherein the first dielectric layer is a first nitride layer, and the second dielectric layer is a second nitride layer.

12. The element of claim 6, further comprising a diffusion layer between the conductive filament layer and the oxygen exchange layer.

13. The element of claim 6, wherein the first and second metal layers are formed of tungsten.

14. A method of forming a resistive memory gain cell comprising:
   patterning logic circuitry over a silicon substrate;
   applying a first interlayer dielectric (ILD) over the logic circuitry;
   patterning a first metal layer to form a source line terminal of a resistive memory element and a bit line read line and a ground terminal of a read transistor of the gain cell;
   applying a second ILD over the first metal layer;
   forming a resistive memory element over the source line in the ILD, a gate channel of the read transistor in the ILD, a metal terminal connecting the resistive memory element and the gate channel, wherein forming a resistive memory element comprises:
      etching an opening in the first ILD over the source line terminal;
      depositing an indium gallium zinc oxide layer in the opening over the source line terminal; and
      depositing a hafnium dioxide layer over the indium gallium zinc oxide layer, and wherein the metal terminal is deposited in part over the hafnium dioxide layer;
   patterning a second metal layer as a common node coupled to the metal terminal of the resistive memory element and a bit line terminal of a write transistor;
   applying a third ILD over the second metal layer;
   forming a gate channel of the write transistor in the third ILD coupled to the common node; and
   patterning a third metal layer as a write line of the write transistor coupled to the gate channel in the third ILD.

15. A method of forming a resistive memory gain cell comprising:
   patterning logic circuitry over a silicon substrate;
   applying a first interlayer dielectric (ILD) over the logic circuitry;
   patterning a first metal layer to form a source line terminal of a resistive memory element and a bit line read line and a ground terminal of a read transistor of the gain cell;
   applying a second ILD over the first metal layer;
   forming a resistive memory element over the source line in the ILD, a gate channel of the read transistor in the ILD, a metal terminal connecting the resistive memory element and the gate channel;
   patterning a second metal layer as a common node coupled to the metal terminal of the resistive memory element and a bit line terminal of a write transistor;
   applying a third ILD over the second metal layer;
   forming a gate channel of the write transistor in the third ILD coupled to the common node; and
   patterning a third metal layer as a write line of the write transistor coupled to the gate channel in the third ILD, the method further comprising depositing a first nitride layer in the opening before depositing the hafnium dioxide and depositing a second nitride layer after depositing the indium gallium zinc oxide layer.

16. A computing system comprising:
   a memory having instructions stored thereon; and
   a processor coupled to the memory to execute the instructions, the processor having silicon logic circuitry formed on a silicon substrate and a memory array having a plurality of gain cells, the memory array being formed in back end metal layers formed over the logic circuitry, the gain cells each having a resistive memory element coupled to a common node at one end to store a value and directly to a source line at another end, the value being read as conductivity between the common node and the source line of the resistive memory element, a write transistor having a source coupled directly to a bit line, a gate coupled to a write line, and a drain coupled to the common node to write a value at the bit line to the resistive memory element upon setting the write line high, and a read transistor having a source coupled to a bit line read line and a gate coupled directly to the common node to read the value written to the resistive memory element as a value at the read transistor gate, wherein the source and drain of the read transistor are formed in a first back end metal layer of a semiconductor die and the common node is formed in a second back end metal layer of the die.

17. The system of claim 16, wherein the resistive memory element is formed of a first metal layer to provide a first electrical terminal, a second metal layer to provide a second electrical terminal, a hafnium dioxide layer between the first electrical terminal and the second electrical terminal, and an indium gallium zinc oxide layer between the hafnium dioxide layer and the second electrical terminal.

18. A resistive random access memory element comprising:
 a first metal layer to provide a first electrical terminal;
 a second metal layer to provide a second electrical terminal, the second electrical terminal having a surface;
 a conductive filament layer between the first electrical terminal and the second electrical terminal;
 an oxygen exchange layer between the conductive filament layer and the second electrical terminal, the oxygen exchange layer having a surface facing the surface of the second electrical terminal;
 a first dielectric layer between the conductive filament layer and the first electrical terminal, wherein the first dielectric layer is a first nitride layer; and
 a second dielectric layer between the oxygen exchange layer and the second electrical terminal, the second dielectric layer in direct contact with the surface of the oxygen exchange layer and in direct contact with the surface of the second electrical terminal, wherein the second dielectric layer is a second nitride layer.

19. A computing system comprising:
 a memory having instructions stored thereon; and
 a processor coupled to the memory to execute the instructions, the processor having silicon logic circuitry formed on a silicon substrate and a memory array having a plurality of gain cells, the memory array being formed in back end metal layers formed over the logic circuitry, the gain cells each having a resistive memory element coupled to a common node at one end to store a value and directly to a source line at another end, the value being read as conductivity between the common node and the source line of the resistive memory element, a write transistor having a source coupled directly to a bit line, a gate coupled to a write line, and a drain coupled to the common node to write a value at the bit line to the resistive memory element upon setting the write line high, and a read transistor having a source coupled to a bit line read line and a gate coupled directly to the common node to read the value written to the resistive memory element as a value at the read transistor gate, wherein the resistive memory element is formed of a first metal layer to provide a first electrical terminal, a second metal layer to provide a second electrical terminal, a hafnium dioxide layer between the first electrical terminal and the second electrical terminal, and an indium gallium zinc oxide layer between the hafnium dioxide layer and the second electrical terminal.

* * * * *